(12) United States Patent
Wiesa

(10) Patent No.: US 6,197,208 B1
(45) Date of Patent: Mar. 6, 2001

(54) METHOD FOR METALLIZING AT LEAST ONE PRINTED CIRCUIT BOARD OR AT LEAST ONE PRESSED SCREEN AND AT LEAST ONE HYBRID

(75) Inventor: Thomas Wiesa, Vaihingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/214,665

(22) PCT Filed: Feb. 6, 1998

(86) PCT No.: PCT/DE98/00336
§ 371 Date: Jan. 7, 1999
§ 102(e) Date: Jan. 7, 1999

(87) PCT Pub. No.: WO98/51136
PCT Pub. Date: Nov. 12, 1998

(30) Foreign Application Priority Data

May 7, 1997 (DE) .............................. 197 19 235

(51) Int. Cl.[7] ...................................... H05K 3/36
(52) U.S. Cl. .................. 216/13; 216/14; 216/16; 216/20; 216/36
(58) Field of Search .................. 216/13, 14, 16, 216/20, 36, 67; 361/776; 439/329

(56) References Cited

U.S. PATENT DOCUMENTS 4,631,820    12/1986    Harada et al. .
6,122,704  *  9/2000    Hass et al. ............................ 711/100

FOREIGN PATENT DOCUMENTS 40 28 440    3/1992    (DE) .
44 22 996    1/1996    (DE) .
2 630 615    10/1989   (FR) .
2 124 433    2/1984    (GB) .
4-133388     5/1992    (JP) .

* cited by examiner

Primary Examiner—Randy Gulakowski
Assistant Examiner—Allan Olsen
(74) Attorney, Agent, or Firm—Kenyon & Kenyon

(57) ABSTRACT

A method for contacting at least one printed circuit board or at least one punched grid and at least one hybrid includes the steps of: forming contact elements in a contacting foil, positioning the contacting foil over the hybrid in such a way that the contact elements are arranged at preselected positions between the printed circuit traces of the hybrid and the printed circuit traces of the printed circuit board, and etching away at least a portion of the contacting foil, such that the contact elements are at least partially freely accessible.

5 Claims, 2 Drawing Sheets

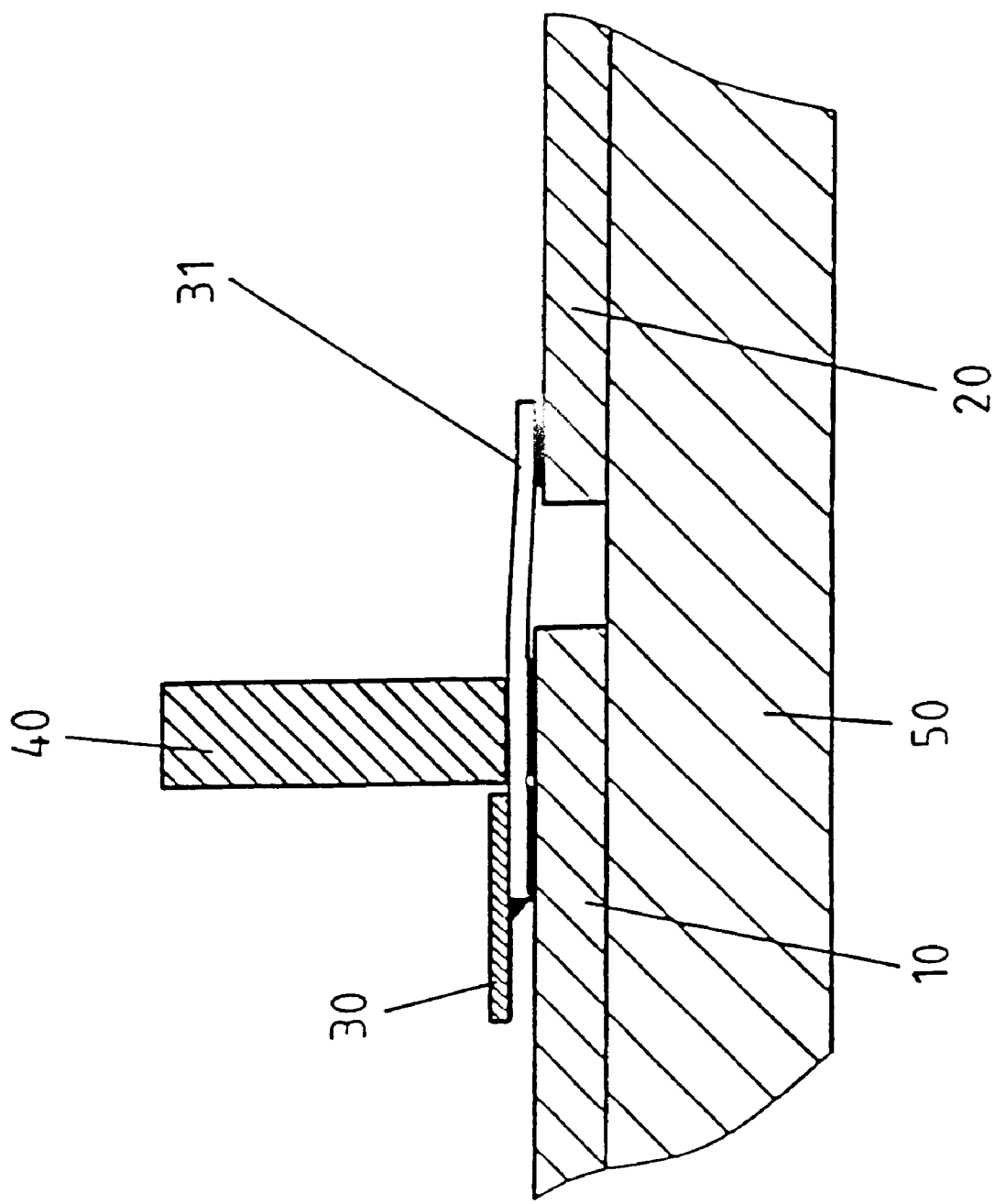

METHOD FOR METALLIZING AT LEAST ONE PRINTED CIRCUIT BOARD OR AT LEAST ONE PRESSED SCREEN AND AT LEAST ONE HYBRID

FIELD OF THE INVENTION

The present invention relates to a method for contacting at least one printed circuit board or at least one punched grid and at least one hybrid which are arranged on a carrier.

BACKGROUND INFORMATION

The many different methods are known for producing printed circuits from at least one printed circuit board and a hybrid.

For example, in the case of hybrids arranged on printed circuit boards, electrical connections between the printed circuit board and the hybrid are produced by solder edges, it being necessary in this case for soldering points to be present both on the printed circuit board and on the hybrid. Arranging these soldering points is time-consuming and not always reliable, since deficiencies can occur in the contacting.

German Patent No. 40 28 440 A1 describes a method for producing printed circuits from at least one printed circuit board and a hybrid, in which at least one unsintered ceramic foil is printed with printed circuit traces, thereupon deformed, subsequently fixed in this form by sintering, and joined to the printed circuit board and/or another hybrid. It may be that the solder edges can be omitted in such a contacting of the printed circuit board and the hybrid. However, it is nevertheless necessary to form electrically conductive connections, e.g., by solder or a conductive adhesive, between the printed circuit board and the hybrid arranged on it. This must be done simultaneously with the mounting of the hybrid on the printed circuit board, and likewise involves the danger that contacting deficiencies can occur.

SUMMARY OF THE INVENTION

Therefore, an object of the present invention is to further develop a method for contacting at least one printed circuit board or at least one punched grid and at least one hybrid, such that a reliable and simultaneous contacting of the printed circuit board or of the punched grid and of the hybrid is possible in the easiest possible technical manner.

This objective is achieved according to the present invention in a method for contacting at least one printed circuit board or at least one punched grid and at least one hybrid, which includes the following steps:

forming contact elements in a contacting foil;

positioning the contacting foil over the hybrid in such a way that the contact elements are arranged at preselected positions between printed circuit traces of the hybrid and printed circuit traces of the printed circuit board;

etching away at least a portion of the contacting foil, such that the contact elements are at least partially freely accessible.

The use of a contacting foil upon which contact elements are formed, and which is positioned over the hybrid so that the contact elements are arranged at preselected positions, and the subsequent etching away of at least a portion of this contacting foil in such a way that the contact elements are at least partially freely accessible, has the particularly great advantage that a simultaneous contacting of the printed circuit board or of the punched grid and the hybrid can be implemented in a manner which is technically unproblematical, and therefore cost-effective as well.

The contacting foil could be completely etched away, so that only the contact elements remain after the etching process. However, a particularly advantageous specific embodiment provides that the contacting foil is completely etched away in the area of the hybrid, and is partially etched away in the area of the contact elements, such that a frame remains, to which the contact elements are attached. The contact elements are stabilized by this frame at preselected positions which are optimal for the contacting.

One advantageous specific embodiment provides for the at least one portion of the contacting foil that is to be etched away, to be etched away by plasma etching.

The most diversified specific embodiments are likewise conceivable as far as the formation or structuring of the contact elements in the contacting foil is concerned.

In one advantageous specific embodiment, the contact elements in the contacting foil are formed by etching. In this way, the contact elements can be formed similarly to the generally known production of printed circuit traces on a printed circuit board in a particularly simple manner.

To permit a further contacting of the hybrid and of the printed circuit board or the punched grid, provision is advantageously made for a tin deposit to be applied on the contact elements, with whose aid further contact elements can be contacted, e.g., by spot soldering or hot-air soldering.

BRIEF DESCRIPTION OF THE DRAWINGS

FIG. 2 shows a part-sectional view along the line II—II of FIG. 1.

DETAILED DESCRIPTION

Figure 1:
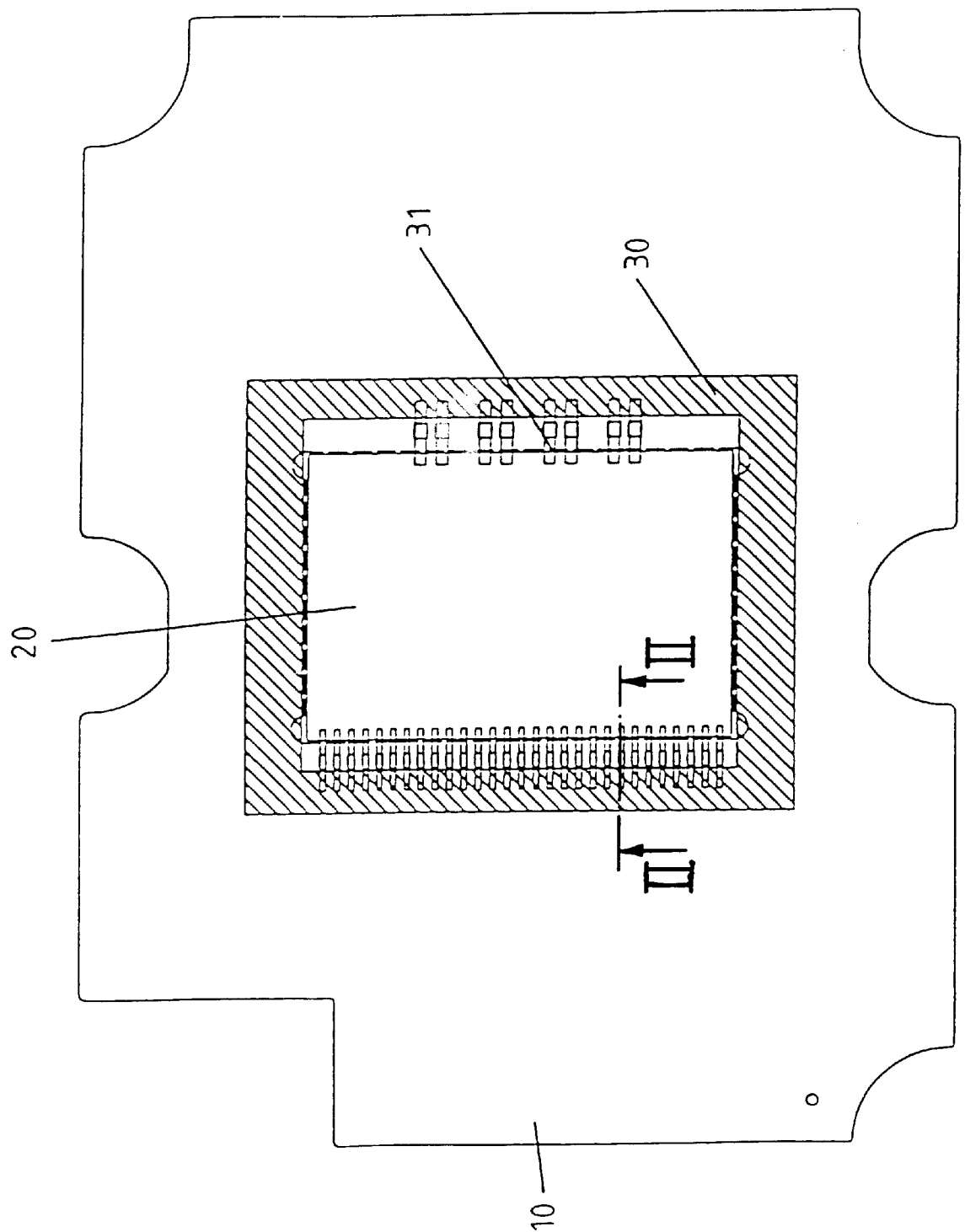
FIG. 1 shows a top view of a printed circuit board and a hybrid, which was contacted according to the method of the present invention.

Below method for contacting a printed circuit board and a hybrid is explained in conjunction with FIGS. 1 and 2.

As can be seen from FIG. 1 and FIG. 2, a printed circuit board 10 and a hybrid 20 are arranged on a carrier 50. Configured both on printed circuit board 10 and on hybrid 20 are printed circuit traces (not shown), which are used for contacting printed circuit board 10 and hybrid 20. At this point, the following procedure is used to form an electrically conductive connection between printed circuit traces of printed circuit board 10 and printed circuit traces of hybrid 20:

Contact elements 31 are patterned in a contacting foil 30 which, e.g., can be a thin polyimide foil. This can be done, for instance, in that, from a copper layer which was applied on the bottom side of the contacting foil, contact elements are formed by etching in a generally known manner—similar to the formation of printed circuit traces on a printed circuit board.

Thereupon, contacting foil 30 is positioned over hybrid 20 in such a way that contact elements 31 are arranged at preselected positions between printed circuit traces of the hybrid and printed circuit traces of the printed circuit board. The contactings of contact elements 31 on printed circuit traces of printed circuit board 10 and on printed circuit traces of hybrid 20 are effected, e.g., by spot soldering or hot-air soldering, or even, for example, by a conductive adhesive.

A portion of contacting foil 30 is then etched away by plasma etching, i.e., organic etching with the assistance of a plasma. Preferably, the contacting foil is etched to such an extent that hybrid 20 is completely exposed. However, as is implied particularly from FIG. 1, contacting foil 30 is not completely etched away. Rather, the etching is carried out in such a way that a frame of contacting foil 30 remains, to which contact elements 31 are attached. This permits stabilization and, at the same time, easy handling of contact elements 31 as well.

Tin solder repositories 40 can be arranged above contact elements 31, which are used for a further contacting of contact elements 31, and thus also of the printed circuit traces of printed circuit board 10 and the printed circuit traces of hybrid 20 which were contacted by contact elements 31.

It should be pointed out that the above-described method for contacting printed circuit board 10 and hybrid 20 does not necessarily require that printed circuit board 10 and hybrid 20 must be arranged on a shared carrier 50. Rather, it is also possible to arrange hybrid 20 directly on printed circuit board 10, and to produce a contacting of the printed circuit trace of printed circuit board 10 and the printed circuit trace of hybrid 20 with the assistance of the method described above.

Furthermore, instead of a printed circuit board 10, a punched grid can also be contacted in the above-described manner.

What is claimed is:

1. A method for contacting one of a printed circuit board and a punched grid, and a hybrid, comprising the steps of:

forming contacting elements in a contacting foil;

positioning the contacting foil over the hybrid so that the contact elements are arranged at preselected positions between printed circuit traces of hybrid and printed circuit traces of the one of the printed circuit board and the punched grid; and etching away at least a portion of the contacting foil so that the contact elements are at least partially freely accessible.

2. The method according to claim 1, wherein the etching step includes the steps of:

completely etched away the contacting foil in an area of the hybrid; and partially etching away the contacting foil in an area of the contact element so that a frame remains, the contact elements being attached to the frame.

3. The method according to claim 1, wherein the etching step includes the step of:

plasma etching the at least portion of the contact foil.

4. The method according to claim 1, wherein the forming step includes the step of:

forming the contact elements in the contacting foil by etching the contacting foil.

5. The method according to claim 1, further including the step of:

applying a tin repository on the contact elements.

* * * * *